US009348953B2

(12) United States Patent
Senno et al.

(10) Patent No.: US 9,348,953 B2
(45) Date of Patent: May 24, 2016

(54) SWING SIMULATION SYSTEM, SWING SIMULATION APPARATUS, AND SWING SIMULATION METHOD

(71) Applicants: BRIDGESTONE CORPORATION, Chuo-ku, Tokyo (JP); BRIDGESTONE SPORTS CO., LTD., Minato-ku, Tokyo (JP)

(72) Inventors: Yoshikazu Senno, Kodaira (JP); Koji Takao, Kodaira (JP); Takashi Saito, Kodaira (JP); Hideo Matsunaga, Chichibu (JP); Hirotada Iwade, Chichibu (JP)

(73) Assignees: BRIDGESTONE CORPORATION, Tokyo (JP); Bridgestone Sports Co., Ltd., Tokyo (JP)

( * ) Notice: Subject to any disclaimer, the term of this patent is extended or adjusted under 35 U.S.C. 154(b) by 497 days.

(21) Appl. No.: 13/857,593

(22) Filed: Apr. 5, 2013

(65) Prior Publication Data

US 2013/0268254 A1    Oct. 10, 2013

(30) Foreign Application Priority Data

Apr. 6, 2012   (JP) .................................. 2012-087694
Dec. 26, 2012  (JP) .................................. 2012-283399

(51) Int. Cl.
*G06G 7/48* (2006.01)
*G06F 17/50* (2006.01)
*G06T 7/00* (2006.01)

(52) U.S. Cl.
CPC .......... *G06F 17/5009* (2013.01); *G06T 7/0042* (2013.01); *G06T 2207/30204* (2013.01); *G06T 2207/30221* (2013.01)

(58) Field of Classification Search
CPC .............. G06F 17/5009; G06T 7/0042; G06T 2207/30204; G06T 2207/30221
USPC .............................................................. 703/6
See application file for complete search history.

(56) References Cited

U.S. PATENT DOCUMENTS

| 6,514,081 B1 * | 2/2003 | Mengoli ...................... 434/252 |
| 2009/0062649 A1 * | 3/2009 | Li et al. ........................ 600/443 |
| 2010/0248837 A1 * | 9/2010 | Suzuki et al. .................. 463/36 |

FOREIGN PATENT DOCUMENTS

| JP | 2002-331060 A | 11/2002 |
| JP | 2005-218783 A | 8/2005 |

(Continued)

OTHER PUBLICATIONS

Ryan Burchfield, S. Venkatesan "A Framework for Golf Training Using Low-Cost Inertial Sensors" 2010 International Conference on Body Sensor Networks 2010, IEEE 978-0-7695-4065-8/10 pp. 267-272.*
Communication from the State Intellectual Property Office of P.R. China dated Dec. 1, 2014 in corresponding Chinese Application No. 201310119847.7.

(Continued)

*Primary Examiner* — Dwin M Craig
(74) *Attorney, Agent, or Firm* — Sughrue Mion, PLLC

(57) ABSTRACT

Provided is a swing simulation system capable of simulating a swing without amplifying errors contained in measured values on three-dimensional coordinates of a grip during the swing. The simulation system according to the present invention includes: at least two imaging devices for imaging identification features capable of identifying a closed virtual plane that follows a grip of a golf club during a swing; and a simulation apparatus for simulating a behavior of the golf club during the swing, based on position information on the virtual plane.

8 Claims, 10 Drawing Sheets

(56) References Cited

FOREIGN PATENT DOCUMENTS

| | | |
|---|---|---|
| JP | 2008-12222 A | 1/2008 |
| JP | 2010-94265 A | 4/2010 |
| JP | 2010-131442 A | 6/2010 |
| JP | 2011183090 A | 9/2011 |

OTHER PUBLICATIONS

Communication dated Jul. 16, 2015, issued by the State Intellectual Property Office of the P.R.C. in corresponding Chinese Application No. 201310119847.7.

* cited by examiner

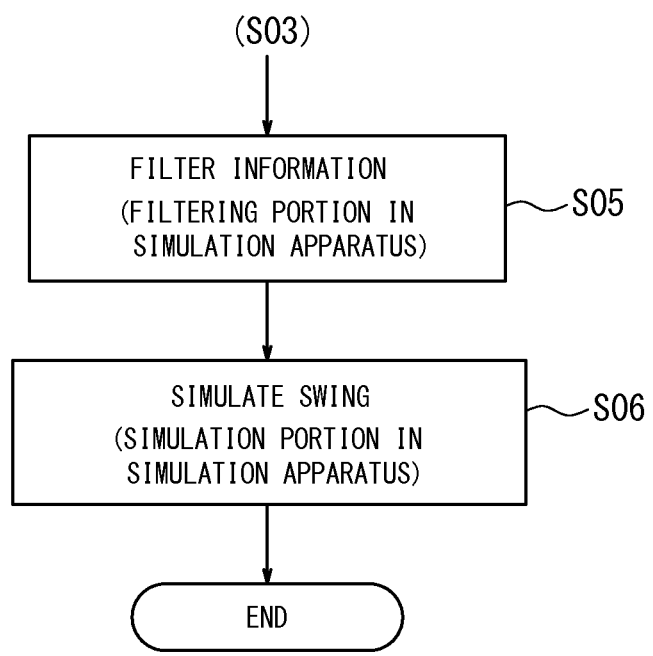

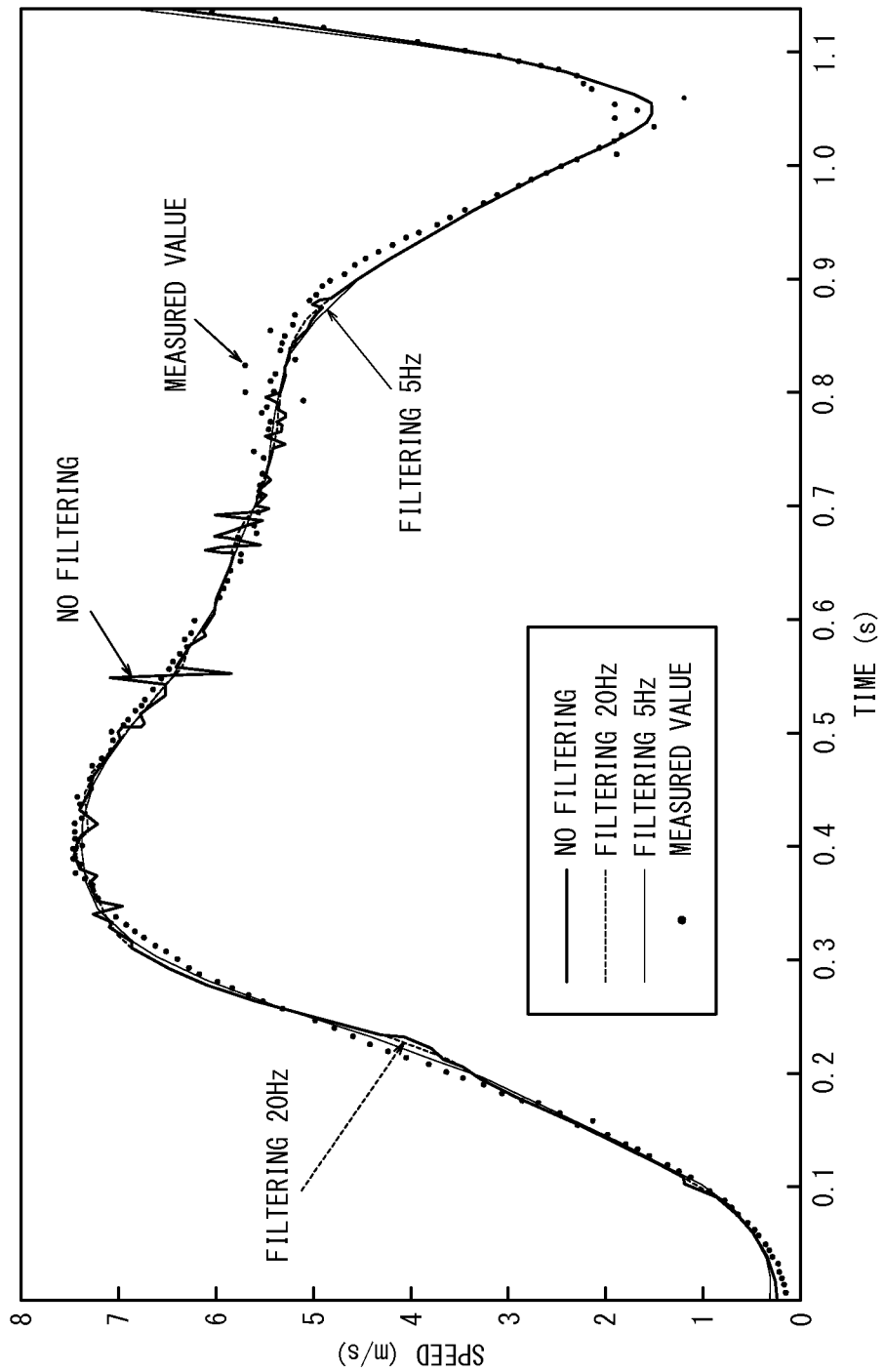

SWING SIMULATION SYSTEM, SWING SIMULATION APPARATUS, AND SWING SIMULATION METHOD

CROSS REFERENCE

The present application claims the priority of Japanese Patent Application No. 2012-087694 filed on Apr. 6, 2012, and Japanese Patent Application No. 2012-283399 filed on Dec. 26, 2012, the contents of which are incorporated herein by reference.

TECHNICAL FIELD

The present invention relates to a swing simulation system, a swing simulation apparatus, and a swing simulation method.

BACKGROUND ART

During a swing made by a golfer, the golf club is subjected to deformation such as deflection and torsion in the shaft thereof. In addition, the club head turns over, and the head speed undergoes change as well. Such behaviors of the golf club, including the deformation of the shaft, the turning of the head, and the change in head speed, all result mainly from inputs that are made by a subject, such as a golfer, making the swing. It is considered extremely important for a golfer to select a golf club capable of attaining an ideal behavior of the golf club.

Therefore, it is very useful to analyze a golf club behavior during a swing, in order for a golfer to select an optimum golf club from among ready-made golf clubs. Further, information to be obtained as a result of such analysis is significantly effective in developing a new golf club.

As a method of analyzing the behavior of a golf club during a swing made by a golfer, there has been hitherto proposed a method of simulating a swing, which involves calculating, from the chronological change of the grip of the golf club on three-dimensional coordinates during the swing, input information on parameters for use in the simulation (see, for example, Patent Literature 1). In this method, a swing can be simulated based on three motions including: a translational motion relative to the global coordinate of the grip; a rotary motion relative to the global coordinates; and a rotary motion (torsion) of the grip about the geometrical center axis of the shaft, the three motions being obtained from the chronological change of the three-dimensionally measured grip coordinates.

CITATION LIST

Patent Literature

PTL 1: JP 2002-331060 A

SUMMARY OF INVENTION

Technical Problem

However, in the simulation method disclosed in PTL 1, the three-dimensional coordinates of the grip during a swing is subjected to image acquisition, and, based on the three-dimensional coordinates thus obtained, time history data on the coordinates of the grip, time history data on the angles of inclination of the grip, and time history data on the angles of rotation of the grip about the axis of the shaft are each calculated, which are then input as parameters. Then, based on these parameters, the translational acceleration of x, y, z on the barycentric position of the grip, the rotation angular acceleration $(rad/sec^2)$ about the x, y, z axes on the barycentric position of the grip, and the rotation angular acceleration $(rad/sec^2)$ about the local coordinate axis are calculated, to thereby simulate the swing.

In this method, the measured values on the three-dimensional coordinates of the grip during the measured swing need to be subjected to two-stage calculations, which make the calculation complicated. Further, the two-stage calculations may amplify errors contained in the measured values of the grip on the three-dimensional coordinates during the swing, with the result that the accuracy of the simulation results is affected. The two-stage calculations herein refer to performing calculation for obtaining the aforementioned input parameters such as the translational acceleration and rotation angular acceleration for use in the simulation, and then additionally performing another calculation for simulation, based on the input parameters.

Therefore, the present invention has been made in view of the aforementioned circumstances, and an object of the invention is to provide a swing simulation system, a swing simulation apparatus, and a swing simulation method which are capable of simulating a swing without amplifying errors contained in the measured values on the three-dimensional coordinates of a grip during the swing.

Solution to Problem

In order to attain the aforementioned object, the present invention provides a swing simulation system for simulating a behavior of a golf club during a swing made by a golfer using the golf club, the system including: at least two imaging devices for capturing images of identification features capable of locating a closed virtual plane that follows a grip of the golf club during the swing; and a simulation apparatus for simulating the behavior of the golf club during the swing, based on position information on the virtual plane.

According to the swing simulation system of the present invention, a swing can be simulated without amplifying errors contained in the measured values of the grip on three-dimensional coordinates during the swing.

Further, in the swing simulation system according to the present invention, the simulation apparatus preferably includes: an image acquiring portion for acquiring, from the imaging devices, the images of the identification features captured during the swing; a position information acquiring portion for recognizing the identification features from the images thus acquired and acquiring position information on the virtual plane based on position information on the identification features thus recognized; and a simulation portion for simulating the behavior of the golf club during the swing by associating the position information on the virtual plane with a golf club model. With this configuration, the functional components incorporated in the simulation apparatus allows for easy simulation of a swing, without amplifying errors contained in the measured values on the three dimensional coordinates of the grip during the swing.

Still further, in the swing simulation system according to the present invention, the simulation apparatus may further include preferably a filtering portion for filtering, using a low-pass filter, the position information on the virtual plane acquired by the position information acquiring portion, and the simulation portion preferably simulates the behavior of the golf club during the swing, based the filtered position information on the virtual plane. This configuration can further improve the simulation accuracy of the golf swing.

Yet further, in the simulation system according to the present invention, the low-pass filter preferably has a cutoff frequency Z (Hz) that satisfies:

$$Z = k \cdot (1/X), k \geq 3$$

where,

X: time (in seconds) it takes from the start of the down swing to the impact; and k: the filter factor (constant). With this configuration, the cutoff frequency can be optimized in cutting noise components contained in the measured data on the golf club, to thereby improve the simulation accuracy.

Furthermore, in the swing simulation system according to the present invention, the golf club model has a grip portion and a shaft portion of the golf club formed as elastic bodies. This configuration can reduce simulation errors that are otherwise generated when the golf club model is configured to have a grip portion as a rigid body while a shaft portion as an elastic body.

Moreover, in the simulation system according to the present invention, the position information on the virtual plane preferably corresponds to position information on three points that are not aligned on the same line, the three points following the golf club. This configuration allows for three-dimensional simulation of a swing.

In order to attain the aforementioned object, the present invention provides a simulation apparatus for simulating a behavior of a golf club during a swing made by a golfer using the golf club, in which the behavior of the golf club during the swing is simulated based on position information on the virtual plane acquired from images of identification features capable of locating a closed virtual plane that follows a grip of the golf club during the swing. The swing simulation apparatus according to the present invention is capable of simulating a swing without amplifying errors contained in the measured values of the grip on the three-dimensional coordinates during the swing.

Further, the swing simulation apparatus according to the present invention, further includes a filtering portion for filtering the position information on the virtual plane by using a low-pass filter, in which the simulation apparatus preferably simulates the behavior of the golf club during the swing, based on the position information thus filtered. In this manner, the simulation accuracy of a swing can further be improved.

In order to attain the aforementioned object, the present invention provides a simulation method for simulating a behavior of a golf club during a swing made by a golfer using the golf club, the method including the steps of: attaching at least three identification features to the golf club in such a manner of allowing the identification features to locate a closed virtual plane that follows a grip of the golf club during the swing; imaging, by at least two imaging devices, the identification features during the swing; acquiring, from position information on the identification features thus imaged, position information on the closed virtual plane that follows the grip of the golf club, and simulating the behavior of the golf club during the swing based on position information on the virtual plane. The swing simulation method according to the present invention is capable of simulating a swing without amplifying errors contained in the measured values of the grip on the three-dimensional coordinates during the swing.

Further, the swing simulation method according to the present invention further includes the step of filtering, using a low-pass filter, the position information on the virtual plane, in which the step of simulating the swing preferably includes the use of the filtered position information on the virtual plane. With this configuration, the simulation accuracy of the swing can further be improved.

Advantageous Effect of Invention

According to the present invention, a swing can be simulated without amplifying errors contained in measured values on three-dimensional coordinates of a grip during the swing.

BRIEF DESCRIPTION OF DRAWINGS

The present invention will be further described below with reference to the accompanying drawings, wherein:

FIG. 7 is a flowchart for illustrating the swing simulation method according to an embodiment of the present invention, in the case of using a filtering portion;

FIG. 8A is a graph for showing, in comparison, simulation results obtained by the simulation system, position information on a virtual plane during a golf swing, and simulation results obtained without filtering the position information on a virtual plane, in a period from the start of a golf swing till after the start of a down swing;

DESCRIPTION OF EMBODIMENTS

In the following, a swing simulation system, a swing simulation apparatus, a swing simulation method according to an embodiment of the present invention are described in detail with reference to the drawings.

Figure 1:
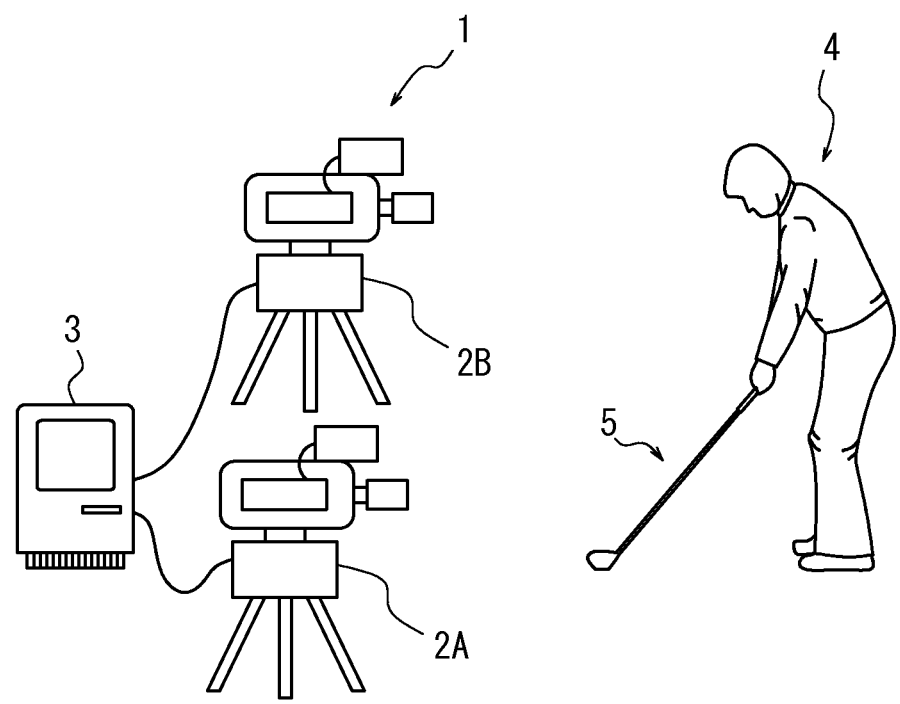
FIG. 1 is a schematic view of a swing simulation system according to an embodiment of the present invention.

FIG. 1 is a schematic view of the swing simulation system according to an embodiment of the present invention. The swing simulation system 1 of FIG. 1 is a simulation system for simulating a swing made by a golfer 4 using a golf club 5. The simulation system 1 includes: at least two imaging devices including a first camera 2A and a second camera 2B; and a simulation apparatus 3 for simulating a swing based on a captured image of the golf club 5.

Figure 4:
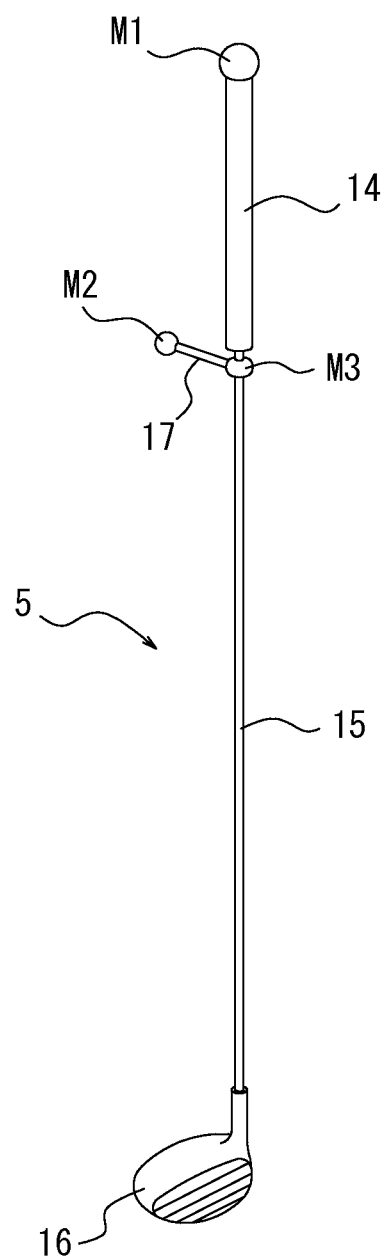
FIG. 4 is a view illustrating an example of a golf club for use in the simulation system according to an embodiment of the present invention.

The first camera 2A and the second camera 2B capture images of markers (not shown) serving as identification features capable of locating a closed virtual plane that follows a grip of the golf club 5 during a swing. Herein, the term "follow a grip" refers to "move along the movement of the grip". In other words, the behavior of the plurality of markers capable of locating a closed virtual plane that follows the grip reflects the movement of the grip. The markers, which are described later in further detail with reference to FIG. 4, are spherical markers disposed so as to be capable of detecting position information on three points that are not aligned on the same line, the markers being distinct in color and material from the surroundings on a captured image of the golf club. The first camera 2A and the second camera 2B are, for example, high-speed video cameras constituting a motion capture system, and capable of imaging an actively moving target with high sensitivity. The first camera 2A and the second camera 2A each capture a swing image at a frame rate of, for example, 160 Hz.

The simulation apparatus 3 acquires position information on a virtual plane, based on images of the markers obtained by the first camera 2A and the second camera 2B during a swing made by the golfer 4, to thereby simulate the swing. The simulation apparatus 3 is configured as a computer including, for example, a central processing unit (CPU) and a digital signal processor (DSP).

Figure 2:
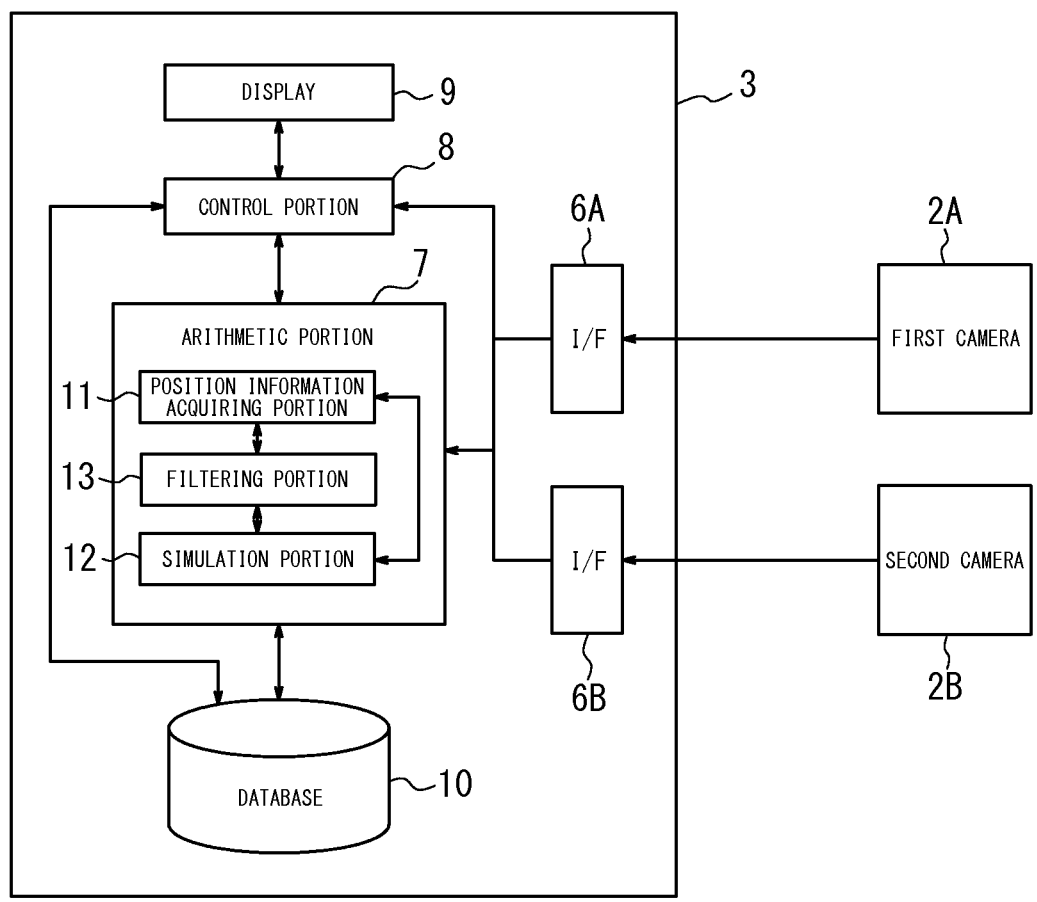
FIG. 2 is a functional block diagram illustrating a schematic configuration of a swing simulation apparatus according to an embodiment of the present invention.

FIG. 2 is a functional block diagram illustrating a schematic configuration of the swing simulation apparatus 3. The simulation apparatus 3 includes: interfaces (I/F) 6A and 6B to serve as an image acquiring portion for acquiring images of the markers during a swing, from the first camera 2A and the second camera 2B; position information acquiring portion 11 for recognizing the markers from the acquired images and acquiring the aforementioned position information on a virtual plane based on the position information on the markers thus recognized; and a simulation portion 12 for simulating a swing by associating the position information on the virtual plane with a golf club model. Further, the simulation apparatus 3 preferably includes a filtering portion 13 for filtering, using a low-pass filter, the position information on the virtual plane obtained by the position information acquiring portion 11. The position information acquiring portion 11, the simulation portion 12, and the filtering portion 13 are included in an arithmetic portion 7 configured as a CPU or DSP. Further, the simulation apparatus 3 may also include: a control portion 8 for controlling the entire operation of the simulation apparatus 3, a display 9 for displaying simulation results; and a database 10 for storing measurement results obtained by the position information acquiring portion 11 and simulation results obtained by the simulation portion 12.

Figure 3:
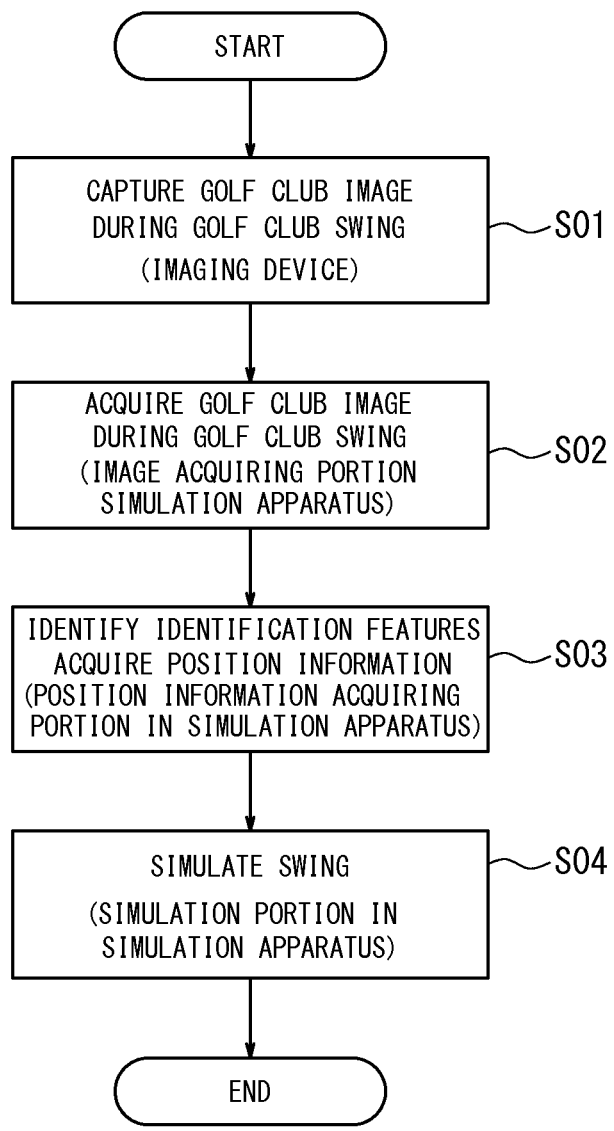
FIG. 3 is a flowchart for illustrating a swing simulation method according to an embodiment of the present invention.

FIG. 3 is a flowchart for illustrating a swing simulation method according to an embodiment of the present invention. Here, the golfer 4 makes a swing using the golf club 5. First, the first and second cameras 2A and 2B serving as the at least two imaging devices capture images of markers that are capable of locating a closed virtual plane that follows the grip of the golf club 5 during a swing (Step S01). Thereafter, the simulation apparatus 3 acquires image data on the markers obtained during the swing from the first and second cameras 2A and 2B, via the I/Fs 6A and 6B serving as the image acquiring portion (Step S02). The image data on the markers thus obtained may be moving image data in an arbitrary form captured by the first and second cameras 2A and 2B.

The simulation apparatus 3 extracts, by the position information acquiring portion 11, arbitrary image data from the image data that has been captured by the first and second cameras 2A and 2B and acquired in Step S02, recognizes the markers in the extracted image data, and acquires position information on the aforementioned virtual plane based on the position information on the markers (Step S03).

The position information acquiring portion 11 recognizes, for example, by circle fitting, the markers attached to the golf club 5 in an arbitrary number of frames extracted from the moving image data acquired from the first and second cameras 2A and 2B. The circle fitting is a method of extracting the outline of a circular marker (or a spherical marker in a three-dimensional space) so as to define a circle that is approximate to the extracted outline, to thereby calculate a virtual center point of the marker. Further, the position information acquiring portion 11 acquires, as the position information on the marker, the three-dimensional coordinates of the marker through three-dimensional image acquisition provided by a general method such as triangulation. The position information acquiring portion 11 may also store, in the database 10, information on the three-dimensional coordinates thus acquired, in association with the golfer who made the swing.

Then, the simulation apparatus 3 simulates a swing using the simulation portion 12, based on the position information on the virtual plane acquired in Step S03 (Step S04). Thus, the simulation apparatus 3 can display an image resulting from the simulation, on the display 9. The simulation results to be displayed on the display 9 include, for example, a deformation of the golf club and time series variations in head speed during the swing. Based on the time series variation in position information on the virtual plane obtained with the use of the golf club 5, there can be simulated another swing to be made by the golfer 4 using a golf club different in specifications from the golf club 5 and the simulation results may be displayed on the display 9.

The simulation portion 12 associates, with a golf club model, the position information on the virtual plane acquired by the position information acquiring portion 11. The position information on the virtual plane corresponds to time series data of the markers on the three-dimensional coordinates at predetermined time intervals set by the position information acquiring portion 11. The simulation method is based on, for example, the multibody dynamics theory. The simulation portion 12 directly associates, as input parameters for the simulation, the three-dimensional coordinates information of the markers acquired by the position information acquiring portion 11 with a golf club model, without subjecting the three-dimensional coordinates information to additional calculation.

Here, the multibody dynamics is a theory to derive an entire motion of a system including a plurality of rigid bodies and elastic bodies that interact with one another, and also to derive a force to be generated in the process thereof. Examples of input parameters to be used in a simulation based on the multibody dynamics theory include information on each of the rigid bodies and the elastic bodies constituting the system, the information including: the mass, the barycentric position, the inertia tensor, the constraint conditions (joint, enforced displacement), the force conditions (a spring, a damping force, a frictional force, a contact force, a gravity, an external force), the initial conditions (an initial position, an initial velocity, an initial attitude, an initial angular velocity), and the numeric value analysis conditions (a selection of a solver, a step size, a tolerance, and analysis time). In general, minimum parameters required for defining the motion of the system are selected from these various parameters, to thereby perform the simulation. The simulation portion 12 holds, prior to the simulation, input parameters to be used for the simulation, based on the specifications of the targeted golf club and data obtained beforehand by predetermined measurement hardware. Examples of the essential input parameters held by the simulation portion 12 include: information on gravity, barycentric position, and inertia moment for the head; information on length, density, sectional shape, flexural rigidity, torsional rigidity, vibration characteristic, and camping characteristic for the shaft; and information on weight, barycentric position, and inertia moment for the grip. Here, the information on inertia moment may be obtained through measurement by, for example, dedicated measurement hardware such as an inertia measuring instrument. Then, in addition to the aforementioned parameters, the simulation portion 12 also uses position information acquired by the position information acquiring portion 11 to perform the simulation. An example of analytical software for use in analysis based on the multibody dynamics theory described above may include MADYMO (registered trademark).

FIG. 4 is a view illustrating an example of a golf club for use in the simulation system according to an embodiment of the present invention. The golf club 5 has a grip 14, a shaft 15, and a head 16. Further, the golf club 5 includes markers M1 to M3 serving as the at least three identification features capable of locating a virtual plane that follows the grip 14. The markers M1 and M3 are disposed on the shaft axis, that is, the centers of the markers are aligned in line with the center axis of the shaft 15 and the grip 14, while the marker M2 is disposed on an attachment member 17 which is protrudingly formed on the shaft 15.

Here, the identification features are not limited to the configuration of the markers M1 to M3 illustrated in the drawings, and may be configured in any form as long as being capable of locating a virtual plane that follows the movement of the grip 14 during a swing. For example, in FIG. 4, the markers M1 and M3 are both arranged such that the centers of the markers are aligned in line with the shaft axis, whereas the marker M3 may alternatively be disposed on an attachment member protrudingly formed on the shaft 15, similarly to the marker M2. It is needless to say that the marker M1 may also be disposed on a position other than the position on the shaft axis. Further, the identification features may be configured by any element other than the markers.

The markers M1 to M3 each have a surface thereof covered with, for example, a reflective tape. Any material other than the reflective tape may also be used to cover the markers M1 to M3, as long as the material can produce a contrast higher than a predetermined value with respect to the surrounding pixels on images captured by the first and second cameras 2A and 2B.

Here, the distance from the center of the marker M2 attached to the tip of the attachment member 17 to the shaft axis is, for example, less than 50 mm, although the present invention is not limited thereto. However, the attachment member 17 itself may be subjected to deflection during a swing if the attachment member 17 is increased excessively in length, which may affect the measurement accuracy. For this reason, the length of the attachment member 17 should be designed so as not to cause deflection therein. Further, the attachment member 17 is formed of a material that is sufficiently high in rigidity, such as, for example, a jig made of steel.

According to the swing simulation system as described above, a swing simulation can be performed without subjecting the position information on the markers, the position information being obtained through three-dimensional image acquisition, to calculation for obtaining the input parameters (for example, the translation acceleration and the rotation angular acceleration of the grip gravity) for the simulation. Therefore, this simulation system is capable of simulating a swing without amplifying errors contained in measured values on the three-dimensional coordinates of the grip obtained during the swing. Further, the simulation system as described above allows for an accurate simulation of a swing, which leads to remarkable reduction in the number of golf clubs to be actually manufactured by way of trial in the development of golf clubs. Further, the system can provide useful information to a golfer who is selecting, from among ready-made golf clubs, a golf club that attains an ideal swing.

Further, the simulation portion 12 preferably simulates a swing on a golf club model having a grip portion, a shaft portion, and a head portion, in which the grip portion and the head portion are configured as rigid bodies while the shaft portion is configured as an elastic body, by associating, with the golf club model, the position information on a virtual plane obtained by the position information acquiring portion 11. This point will be described below in further detail with reference to FIG. 5.

Figure 5:
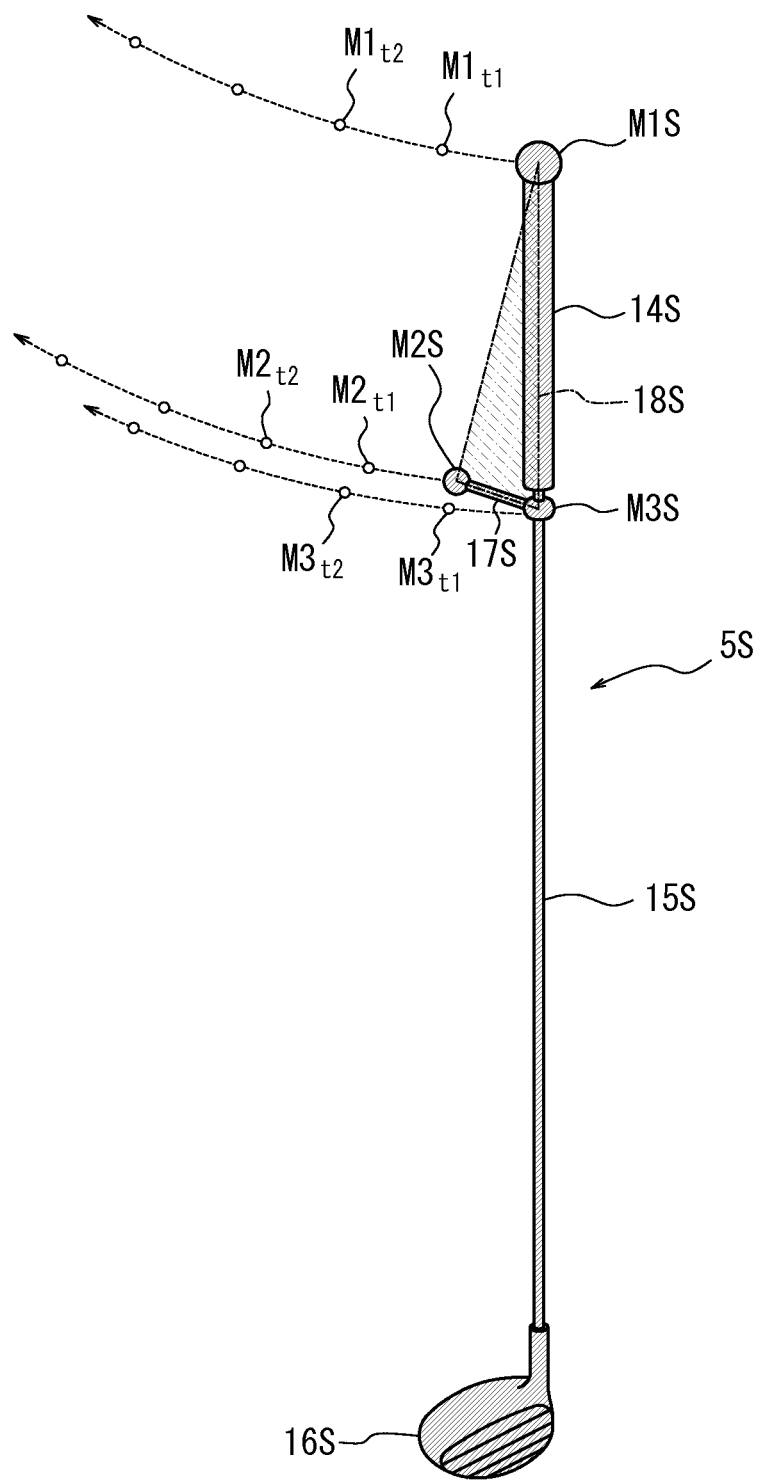
FIG. 5 is a view illustrating an example of a golf club model for use in the simulation system according to an embodiment of the present invention.

FIG. 5 is a view illustrating an example of a golf club model for use in the simulation system according to an embodiment of the present invention. The golf club model 5S has a grip portion 14S, a shaft portion 15S, and a head portion 16S, similarly to the golf club 5 of FIG. 4. Further, the golf club model 5S has marker portions M1S to M3S each corresponding to the markers M1 to M3 of FIG. 4, respectively. The marker portions M1S to M3S define a virtual plane 18S. The virtual plane 18S is a closed plane defined by the marker portions M1S to M3S. Here, the golf club model 5S may have the grip portion 14S configured as a rigid body. Alternatively, in the case of filtering the position information on the virtual plane by the filtering portion 13 to be described later, the golf club model 5S may be configured as an elastic body in its entirety.

FIG. 5 shows, as the position information on the markers M1 to M3 obtained by the position information acquiring portion 11, dots $M1_{tn}$ to $M3_{tn}$ which are the positions of the marker portions M1S to M3S at time tn. In this context, the positions of the marker portions M1S to M3S at time t1 each correspond to dots $M1_{t1}$ to $M3_{t1}$, respectively, and the positions of the marker portions M1S to M3S at time t2 each correspond to dots $M1_{t2}$ to $M3_{t2}$, respectively. Supposing there occurs no error in the three-dimensional image acquisition by the position information acquiring portion 11, the relative positional relation among the dots $M1_{t1}$ to $M3_{t1}$ becomes identical to the relative positional relation among the dots $M1_{t2}$ to $M3_{t2}$. However, it is extremely rare that the position information obtained through three-dimensional image acquisition contains no error, and the position information thus obtained often contains some errors even as small as about several millimeters.

To associate the position information on the virtual plane 18S with the golf club model 5S by the simulation portion 12, position information on the dots $M1_{tn}$ to $M3_{tn}$, which are the position information on the marker portions M1S to M3S, is given to the golf club model 5S. Then, a swing is simulated in such a manner to allow the positions of the marker portions M1S to M3S, which are attached as being capable of locating the virtual plane that follows the grip portion 14S configured as a rigid body on the golf club model 5S, to follow the position information obtained by the position information acquiring portion 11. Here, the term "follow the position information" is equal in meaning to binding the dots $M1_{tn}$ to $M3_{tn}$ down to the marker portions M1S to M3S attached to the golf club model 5S on the simulation, based on the position information acquired by the position information acquiring portion 11. This calculation can be implemented by commercially available analytical software based on the multibody dynamics theory, such as MADYMO (registered trademark) described above. Specifically, the positions of the marker portions M1S to M3S on the golf club model 5S are bound to the dots $M1_{t1}$ to $M3_{t1}$ at the time t1, and to the dots $M1_{t2}$ to $M3_{t2}$ at the time t2.

As described above, temporal position information during a swing is provided to the golf club model 5S, to thereby provide six degrees of freedom in total to the marker portions M1S to M3S constituting the virtual plane 18S. This way defines the movement of the grip portion 14S as a rigid body. In this manner, the movement of the grip portion 14S as a rigid body is provided, which allows a swing to be simulated without the need to perform a step of newly calculating, based on the position information on the marker portions M1S to M3S, input parameters for the simulation. As a result, accuracy in measured value on the three-dimensional coordinates of the grip obtained during a swing can be prevented from being deteriorated, so as to obtain the simulation results without amplifying therein the effect of the three-dimensional measurement errors made by the position information acquiring portion 11.

On the other hand, in the case of simulating a swing without filtering the position information on the virtual plane by the filtering portion 13, the relative relation among the dots $M1_{tn}$ to $M3_{tn}$ fluctuates due to measurement errors or the like if the golf club model is configured as an elastic body in its entirety, which may lead to a fear that the measurement errors significantly affect the simulation results. At this time, an excessive force is generated in the simulation among M1S, M2S, and M3S disposed on the elastic body, with the result that the calculation may be diverged. As a result, the simulation results are greatly affected even if there is only one piece of measurement data having a large error, because the golf club model configured as an elastic body is entirely subjected to distortion due to the error.

In view of the above, the golf club model 5S is configured to have the grip portion 14S formed as a rigid body while the shaft portion 15S formed as an elastic body in the case of simulating a swing without filtering the position information on the virtual plane by the filtering portion 13, to thereby avoid the aforementioned problems. Further, the grip portion 14S formed as a rigid body on the golf club model 5S can realize a simulation that is robust against variations in measurement data. Further, input parameters are given as temporal information of the virtual plane 18S as described above, with the grip portion 14S being formed as a rigid body, so that an error in the position information can be prevented from being reflected as the deformation of the golf club model 5S on the simulation results and swing information included in the position information can be directly reflected by 100% on the simulation results.

In the following, an exemplary simulation result obtained by the simulation system according to this embodiment is described with reference to FIGS. 6A and 6B.

Figure 6A:
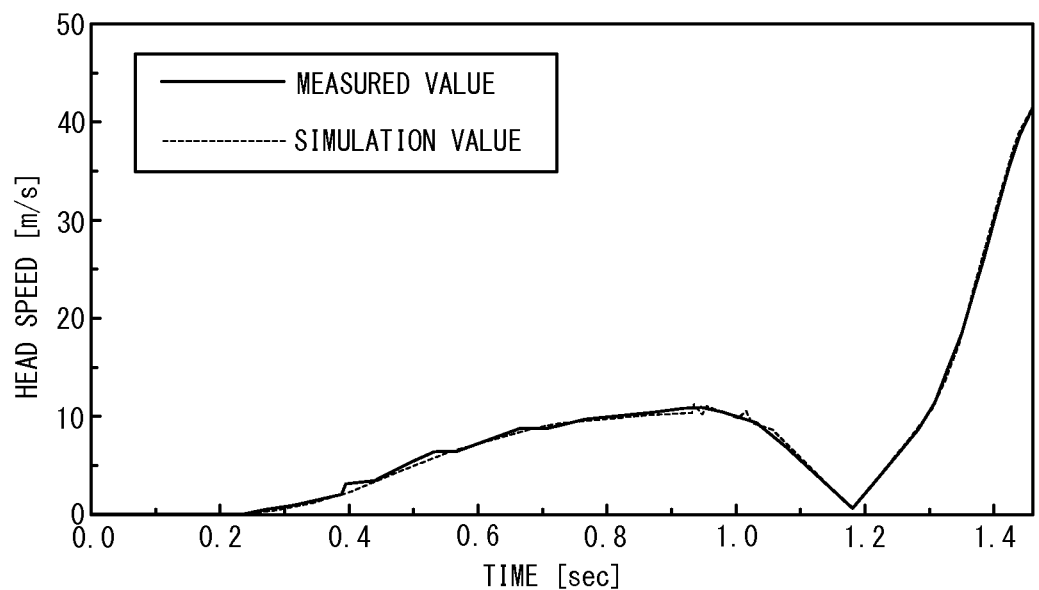
FIG. 6A is a graph showing an exemplary simulation result obtained by using the simulation system according to an embodiment of the present invention.
Figure 6B:
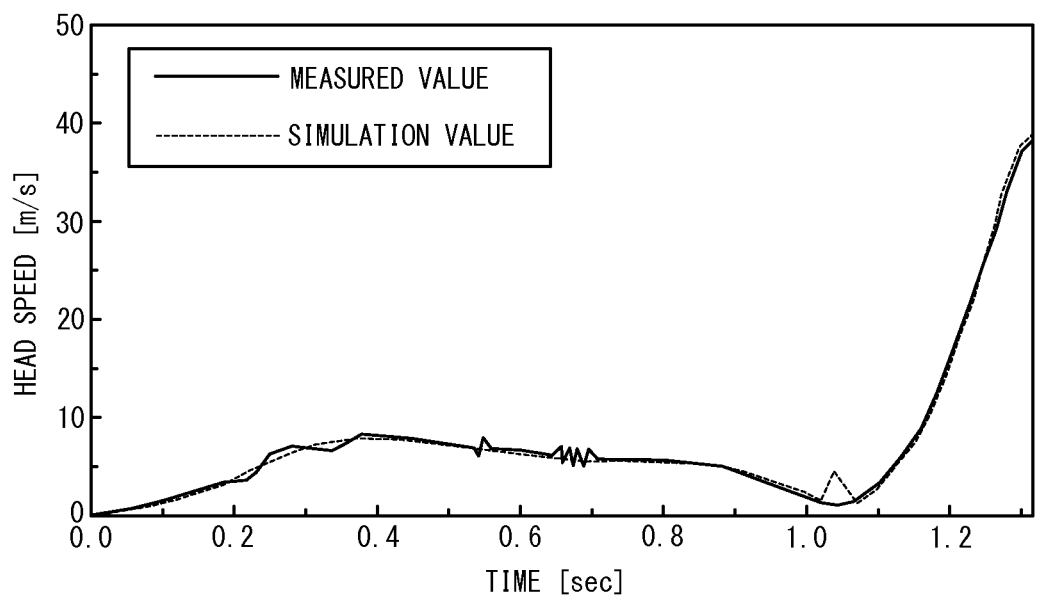
FIG. 6B is a graph showing another exemplary simulation result obtained by using the simulation system according to an embodiment of the present invention.

FIGS. 6A and 6B each are a graph showing an exemplary simulation result obtained by using the simulation system according to an embodiment of the present invention. In the graphs, the measured values each represent a head speed calculated based on temporal position information on markers obtained by imaging, by a motion capture system, a swing made by a golfer using a golf club (hereinafter referred to as golf club A) having the markers on the head. On the other hand, the simulation values each represent a head speed obtained by the aforementioned simulation system 1. A simulation was performed by the simulation portion 12 in the simulation apparatus 3, in which the position information on the markers (position information on the virtual plane) that is obtained in advance for a swing made by a golfer using a golf club such as the golf club 5 for measurement and stored in the database 10 was read out, and parameters necessary in performing a simulation on the golf club A (for example, information on gravity, barycentric position, and inertia moment for the head; information on length, density, sectional shape, flexural rigidity, torsional rigidity, vibration characteristic, and camping characteristic for the shaft; and information on weight, barycentric position, and inertia moment for the grip) were also used. Here, the golf club 5 is different from the golf club A. Further, the simulation apparatus 3 receives an input based on the specifications of the golf club A, to thereby hold parameters for the golf club A in advance.

FIGS. 6A and 6B each are a graph showing, in comparison, the measured value and the simulation value obtained for a swing made by another examinee. As is apparent from the results thereof, the simulation value and the measured value show excellent agreement with each other. As described above, the simulation system according to this embodiment is capable of simulating a swing with high accuracy. Therefore, there can be provided information useful in design and development of golf clubs. Further, the number of golf clubs to be manufactured by way of trial in the course of design and development of golf clubs is reduced, to thereby significantly shorten the development period.

Further, the system can also be applied when a golfer is selecting a golf club. In this application, swing data of one golfer needs to be simulated only once in order to simulate another swing made by the same golfer using a different golf club, which eliminates the need for the golfer to repeatedly visit a store to try different golf clubs. In this manner, the system can save the golfer time and trouble in selecting an optimum golf club.

FIG. 7 is a flowchart for illustrating the swing simulation method according to an embodiment of the present invention, in the case of using a filtering portion. Here, the golfer 4 makes a swing using the golf club 5. First, the simulation apparatus 3 performs a step of filtering with the use of a low-pass filter, by the filtering portion 13, the position information on the virtual plane acquired in Step S03 of FIG. 3 (Step S05). At this time, high frequency noise significantly affects the position information to cause variations therein.

In general, a swing made by a golfer involves: a back swing as a step of swinging up the golf club; a down swing as a step of swinging down the golf club to hit the golf ball; and a follow through to swing through to completion. During the swing, the speed of the golf club's movement reaches maximum during the down swing, and therefore, the position information during the down swing is converted into highest frequency components. Specifically, the down swing movement takes about 0.2 seconds to 0.5 seconds, which is converted into frequency components of about 2 Hz to 5 Hz. Therefore, in the filtering portion 13, the low-pass filter preferably has a cutoff frequency Z set sufficiently higher than the frequency components of the down swing, the frequency components being highest among those obtained from the three steps involved in the swing. The reason is to cut noise components contained in the acquired position information, the noise components being derived from frequencies irrelevant to the golf swing. The noise components are considered to significantly affect the position information to cause variations therein. The low-pass filter preferably has a filter factor k of at least 3. The upper limit of the filter factor k may be an arbitrary value that can make smooth the waveform of the head speed, and may be set to, for example, 15, in line with the upper limit value of the cutoff frequency. When the cutoff frequency Z is too small in value, the maximum head speed to be obtained by the simulation is less likely to coincide with the measured value. On the other hand, when the cutoff frequency Z is too large in value, the low-pass filter fails to sufficiently cut the noise components, which may make non-smooth the waveform of the head speed. Here, the head speed generally reaches its maximum around the impact point where the golf club hit the golf ball.

Here, the cutoff frequency Z preferably satisfies the following Expression:

$$Z = k \cdot (1/X) \quad k \geq 3$$

where,

X: time (in seconds) it takes from the start of the down swing to the impact;

k: the filter factor (constant); and

Z: the cutoff frequency (Hz) of the low-pass filter.

Here, the time X (in seconds) it takes from the start of the down swing to the impact may be calculated as follows, for example. First, the start point of the down swing may be arbitrarily determined through image analysis of images captured by the first and second cameras 2A and 2B. Alternatively, in the case where the simulation is performed using the position information on the virtual plane, the start point of the down swing may be provided as the minimum on the function showing the simulation result with no filtering, the minimum being a point when the head speed first takes a rapid upward turn after having fallen since the start of the golf swing. Next, the impact point may also be arbitrarily determined through image analysis, as in the case of determining the start point of the down swing. Preferably, the impact point may be provided as the maximum on the aforementioned function, the maximum being a point when the head speed first takes a downward turn after having risen since the start of the down swing.

Further, the upper limit of the cutoff frequency Z may be a value that can make smooth the waveform of the head speed, and may be set to, for example, 30 Hz. For example, X is as long as 0.5 seconds, the cutoff frequency Z may be set to an arbitrary value of 6 Hz to 30 Hz, while X is as short as 0.2 seconds, the cutoff frequency Z may be set to an arbitrary value of 15 Hz to 30 Hz. Preferably, the cutoff frequency Z may be a value obtained by setting k=3 to 4.

Table 1 shows the results of simulations performed for examinees with different swing speeds with the optimized cutoff frequencies Z, the evaluation results obtained by comparing the simulation results with the measured values, and the evaluation results on the continuity of the speed. The examinees 1 to 3 each are a golfer with high swing speed, a golfer with normal swing speed, and a golfer with low swing speed, respectively. In the evaluation results obtained by comparing the simulation results with the measured values, A represents a high degree of coincidence between the simulation value and the measured value, B represents a medium degree of coincidence, and C represents a low degree of coincidence. The degree of coincidence is determined as A to C, based on the following criteria: A: the difference in speed between the simulation result with no filtering and the measured value is less than 1.5 m/s; B: the difference in speed between the simulation result with no filtering and the measured value is 1.5 m/s or more and less than 2.0 m/s; C: the difference in speed between the simulation result with no filtering and the measured value is 2.0 m/s or more. Here, X stands for the time (in seconds) it takes from the start of the down swing to the impact. Further, provided as the continuity of the speed are the evaluation results on the continuity in speed change. In general, the head speed during a swing is assumed to change continuously, and hence, the continuity of the speed can be assumed as excellent (A) when the simulation results are properly obtained. The continuity of the speed is determined as A to C, based on the following criteria. That is, A: the simulation results are obtained as a smooth waveform; B: the simulation results are obtained as a non-smooth waveform that is though not enough to cease the calculation in the simulation; C: the simulation results are obtained as a waveform that is too rough to converge the calculation in the simulation. Too many variations in the values of the head speed obtained as the simulation results fail to converge the calculation during the simulation, making the calculation endless.

TABLE 1

| Examinee | Simulation Value (m/s) | | | | | |
| --- | --- | --- | --- | --- | --- | --- |
| | with no filtering | 30 Hz | 20 Hz | 15 Hz | 10 Hz | 5 Hz |
| 1 | 31.1 | 30.2 | 29.9 | 30.0 | 30.2 | 29.6 |
| (1/X: 2.8 Hz) | A | A | A | A | A | B |
| 2 | 37.6 | 37.4 | 37.1 | 37.1 | 37.0 | 35.3 |
| (1/X: 3.3 Hz) | A | A | A | A | A | C |
| 3 | 46.3 | 46.7 | 46.3 | 45.8 | 44.7 | 43.5 |
| (1/X: 4.8 Hz) | A | A | A | A | C | C |
| Continuity of Speed | C | B | A | A | A | A |

Table 1 shows that the cutoff frequencies Z optimized based on the aforementioned Expression are capable of reducing noise, to thereby improve simulation accuracy.

In the simulation apparatus 3 performs, in the simulation portion 12, a simulation step of simulating a swing based on the filtered position information (Step S06). The simulation apparatus 3 may display, on the display 9, an image obtained as the simulation results. Information displayed as the simulation results on the display 9 in this embodiment includes, for example, a deformation of the golf club and time series variations in head speed during the swing. Another swing made by the golfer 4 using a golf club having different specifications from the golf club 5 may be simulated based on the position information associated with the swing made with the use of the golf club 5, and the simulation results may also be displayed on the display 9. With reference to the information thus displayed on the display 9, the golfer can select an optimal golf club from among ready-made golf clubs. Further, no analysis has hitherto been made of the force to be applied to the shaft during a swing, whereas the simulation apparatus of the present invention allows for visualization of the deformation of the golf club during a swing. This makes it possible to analyze how the shaft shape is influenced by force applied to the shaft during a swing.

Here, in this example, the simulation portion 12 associates the filtered position information acquired in Step S05, with a golf club model having the grip portion and the shaft portion formed as elastic bodies. With a golf club model in this example, which has the grip portion and the shaft portion both formed as elastic bodies as described above, there is offered an advantage that it eliminates the need for correcting the flexural rigidity in a simulation, as described in below.

In a conventional simulation method, parameters for translational and rotational motion of a golf club are derived from actually-measured data on the translational motion of three points that are not aligned on the same line, the three points following the movement of the grip of the golf club, and the parameters are given to a golf club model, to thereby perform a simulation (see, for example, JP 2004-242907 A). The golf club model for use in a simulation as described above has been designed to have at least the grip portion of the golf club formed as a rigid body. In this simulation, the grip portion is formed as a rigid body, so that the golf club model can be made robust against errors in the measured data to be used for giving parameters. However, in a golf club model having the grip portion formed as a rigid body and the shaft portion formed as an elastic body, the values of flexural rigidity (EI) become discontinuous at the boundary between the grip portion and the shaft portion, generating a rigidity difference. As a result, the rigidity difference serves to generate a stress, which is not actually generated, between the grip portion and the shaft portion in the simulation, leading to a fear of deteriorating accuracy of the simulation, and hence it has been required correct the flexural rigidity.

In contrast, according to this embodiment, the grip portion and the shaft portion of the golf club model are both formed as elastic bodies, and hence no rigidity difference is generated in the golf club model. As described above, in a conventional golf club model, at least the grip portion is designed as a rigid body in order to make the golf club model robust against errors in the measured data. However, in this example, the position information is filtered, so as to reduce error components contained in the position information acquired by the position information acquiring portion 11 before the position information is input to the golf club model. Therefore, according to this example, even with the use of a golf club model with the grip portion and the shaft portion both formed as elastic bodies, there can be obtained simulation results robust against the measurement errors in the input parameter information.

As described above, according to the simulation system of this example, the simulation results are less affected by noise components contained in the position information on the virtual plane during a swing. Further, the grip portion and the shaft portion of the golf club model can both be formed as elastic bodies, which can avoid the generation of errors resulting from the flexural rigidity difference in the golf club model which may occur in a golf club model formed as a combination of the rigid body and the elastic body in a conventional simulation method.

Further, having both the grip portion and the shaft portion made as elastic bodies allows for directly reflecting, on the simulation results, input parameters such as flexural rigidity, torsional rigidity, vibration characteristics, and dynamic characteristics (such as, for example, character frequency and a damping ratio) of the golf club to be simulated, to thereby obtain simulation results closer to the actual swing behavior.

As described above, the simulation system of this example is capable of simulating a behavior of a golf club during a swing, based on the position information on the virtual plane obtained during the swing, and input parameters such as flexural rigidity, torsional rigidity, vibration characteristics, and dynamic characteristics of the golf club. Further, the simulation system of this example is capable of predicting, based on the position information of the swing, specifications (such as flexural rigidity, torsional rigidity, vibration characteristics, and dynamic characteristics) for an optimum golf club. Therefore, there can be uniquely calculated, by the finite element method, a golf club configuration capable of attaining the flexural rigidity and the torsional rigidity predicted by the simulation system of this example. Further, for example, a golf club with certain specifications may be subjected to simulation of the golf club behavior during a swing, by using an ideal swing behavior (for example, position information on a virtual plane obtained for a swing made by a professional player) and position information on a swing made by the examinee, to thereby investigate, based on the simulation results, how to bring the swing close to ideal.

Figure 8B:
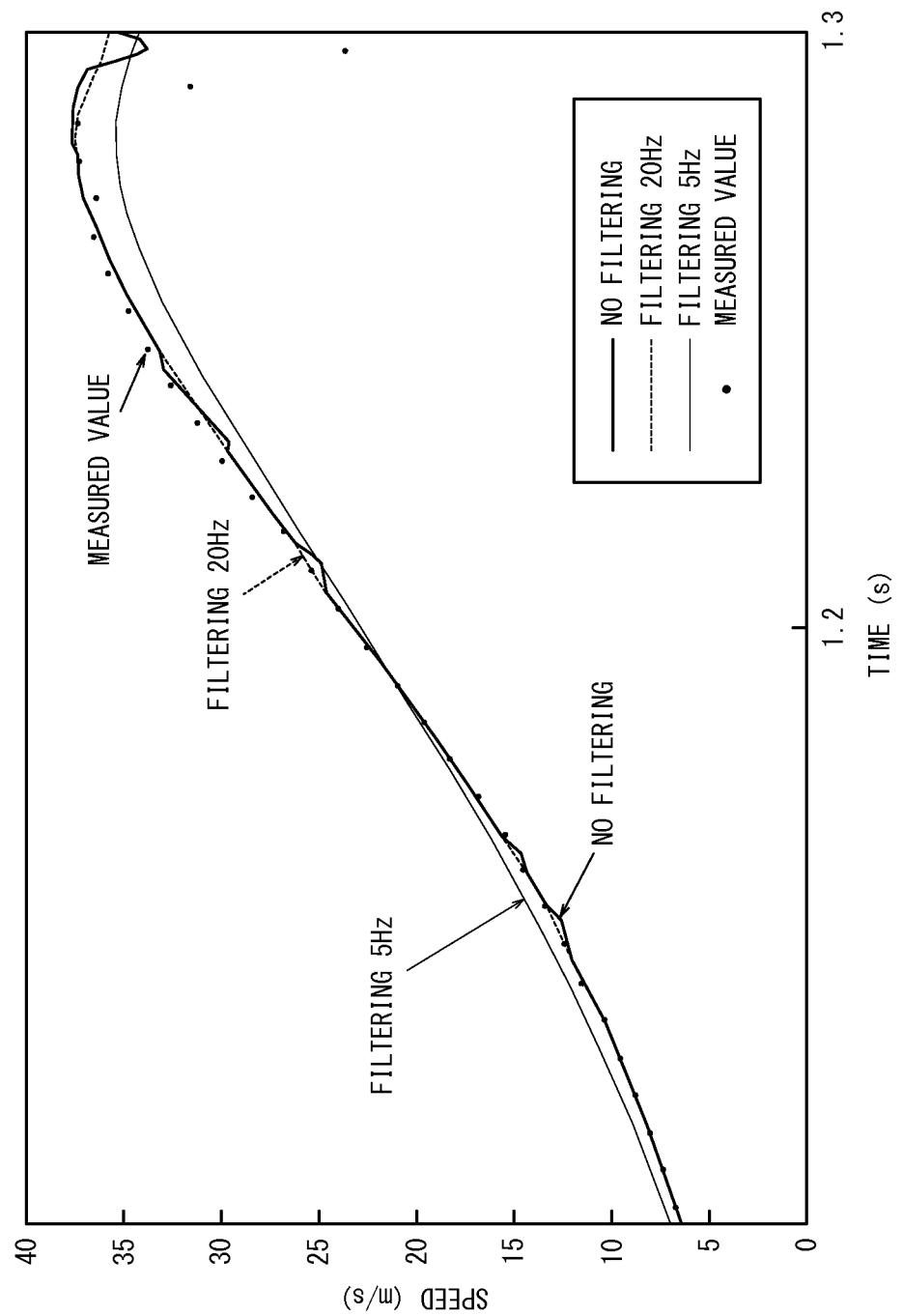
FIG. 8B is a graph for showing, in comparison, simulation results obtained by the simulation system, position information on a virtual plane during a golf swing, and simulation results obtained without filtering the position information on a virtual plane, in a period after the start of the down swing till after an impact is made.

FIGS. 8A and 8B are graphs each showing, in comparison, simulation results and position information on a virtual plane during a golf swing obtained by the simulation system of this embodiment, and simulation results obtained without filtering the position information on a virtual plane. In the golf swing shown in FIGS. 8A and 8B, the down swing starts at 1.08 seconds, which is a point at the minimum where the head speed first takes a rapid upward turn after having fallen since the start of the golf swing. The impact point is at 1.28 seconds, which is the maximum where the head speed first takes a downward turn after having risen since the start of the down swing. In this case, the time X it takes from the start of the down swing to the impact is 0.2 seconds, with the swing frequency being 5 Hz. Further, in simulating the swing, the filter factor is set to 1 or 4, and the cutoff frequency Z is set to 5 Hz or 20 Hz. As is apparent from FIG. 8A, the simulation results with no filtering are affected by noise, whereas the influence of such noise is suppressed with the cutoff frequency Z of 5 Hz or 20 Hz. Further, as is apparent from FIG. 8B, with the cutoff frequency Z of 20 Hz, the simulation value and the measured value showed an excellent match in the vicinity of the impact point around at 1.3 seconds after the start of the golf swing, as compared to the case where the cutoff frequency Z was set to 5 Hz, which means that the filter factor is preferably set to at least 3.

As described above, the simulation system according to this embodiment has reduced the influence to be exerted onto the simulation results by the noise components included in the position information. Further, according to this system, information on the change in head speed can be obtained in association with a swing behavior, and thus the simulation swing waveform has less fluctuations, which means that noise components have been removed.

Figure 9:
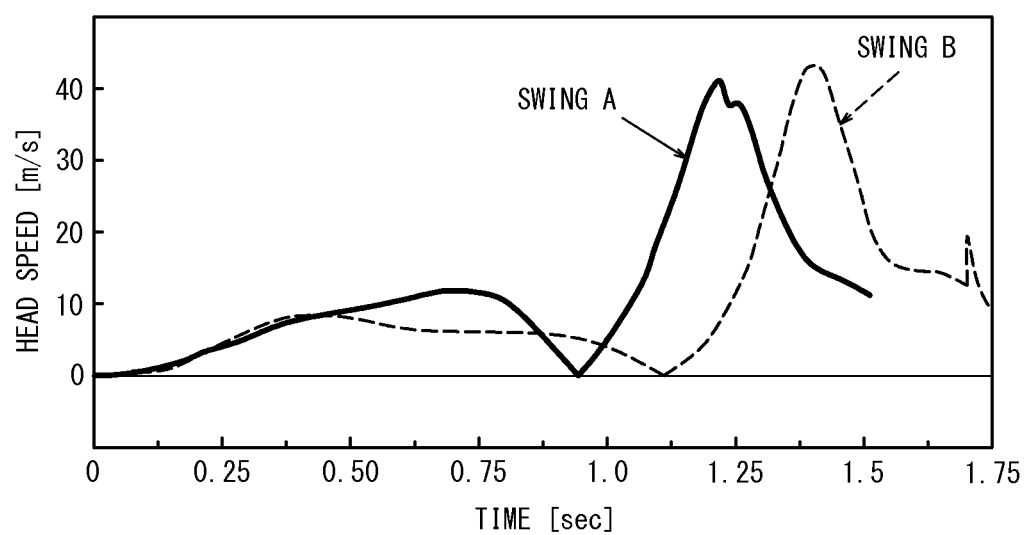
FIG. 9 is a graph showing an exemplary simulation result obtained by using the simulation system according to an embodiment of the present invention.

FIG. 9 is a graph showing an exemplary simulation result obtained by using the simulation system according to an embodiment of the present invention. The position information on the virtual plane used in the simulation is obtained by capturing, by a motion capture system, a swing made by a golfer using a golf club. The golf club has at least three markers attached thereon, the three markers not being aligned on the same line with respect to the grip, and the position information on the virtual plane corresponds to time series position information on these markers obtained from the start of the swing. In simulating the swing, a low-pass filter was used to filter the position information on the virtual plane with 20 Hz as a threshold value so as to allow only the frequency components of less than 20 Hz to pass therethrough. In the graph, swings A and B show head speed values during a swing made by examinees A and B, the head speed values being calculated based on the filtered position information on the virtual plane. As shown in the graph, both of the swing profiles have less fluctuation components, which means that the profiles are less affected by noise components.

It is apparent for a person skilled in the art that a number of modifications and substitutions are possible within the gist and scope of the present invention described above. Therefore, the present invention should not be construed as being limited to the aforementioned embodiment, and may be subjected to various modifications and alterations without departing from the scope of claims.

For example, the simulation system may also be configured as follows. That is, the golf club model may be designed as an elastic body in its entirety, rather than forming the grip as a rigid body and the rest as an elastic body, so that the measurement errors in the marker position information can be offset, assuming that the identification features (markers) and the position information on the markers obtained by a three-dimensional image acquisition are coupled to each other via a spring and a damper. This configuration can suppress the deformation of the golf club model resulting from the measurement errors occurring in the image acquisition.

Further, for example, the simulation system may also be configured, using a golf club model designed as an elastic body in its entirety, to subject the time series position information on the markers to smoothing so that a virtual plane defined by the dots $M1_m$ to $M3_m$ serving as time series data on the marker portions M1S to M3S always coincides with a virtual plane defined by the marker portions M1S to M3S in a stationary state. In smoothing the information, the simulation system performs the smoothing process by maintaining the swing characteristics. This configuration can also suppress the deformation of the golf club model resulting from the measurement errors occurring in the image acquisition.

In addition, for example, the simulation system may also be configured, using a golf club model designed as an elastic body in its entirety, to allow a virtual plane defined by markers disposed on at least three points to follow the time series position information on the at least three markers through proportional-integral-derivative (PID) control. This configuration can also suppress the deformation of the golf club model resulting from the measurement errors occurring in the image acquisition.

Further, in the case where the filtering portion 13 filters the position information on a virtual plane acquired by the position information acquiring portion 11, the first and second cameras 2A and 2B may be configured as at least one sensor attached to the golf club 5. The sensor may be configured as, for example, a gyro sensor, or may be any sensor capable of measuring at least one of acceleration, angular velocity, and geomagnetic field. The sensor may be disposed at any one of the positions of the markers M1 to M3 of FIG. 4. In order to obtain at least six degrees of freedom, which is necessary to determine the motion of a rigid body, for example, one gyro sensor is disposed at a grip end (position of M1 of FIG. 4) to obtain six degrees of freedom of the acceleration (ax, ay, az) and the angular velocity (ωx, ωy, ωz) measured by the sensor, to thereby determine the motion of the golf club 5. This configuration requires only one gyro sensor to be attached to the golf club 5 to determine the motion of the golf club, which makes it easy to perform the measurement.

REFERENCE SIGNS LIST 1 simulation system
2A, 2B imaging device
3 simulation apparatus
5 golf club
5S golf club model
6A, 6B image acquiring portion
11 position information acquiring portion
12 simulation portion
13 filtering portion
14 grip
14S grip portion
15 shaft
15S shaft portion
16 head
16S head portion
18S virtual plane
M1, M2, M3 marker
M1S, M2S, M3S marker portion

The invention claimed is:

1. A simulation system for simulating a behavior of a golf club during a swing made by a golfer using the golf club, comprising:
    at least two imaging devices for capturing images of at least three identification features capable of locating a closed virtual plane, defined by the at least three identification features, that follows a grip of the golf club during the swing; and
    a simulation apparatus for simulating the behavior of the golf club during the swing, based on position information on the virtual plane.

2. The simulation system according to claim 1,
    wherein the simulation apparatus includes:
        an image acquiring portion for acquiring, from the imaging devices, the images of the identification features captured during the swing;
        a position information acquiring portion for recognizing the identification features from the images thus acquired and acquiring position information on the virtual plane based on position information on the identification features thus recognized; and
        a simulation portion for simulating the behavior of the golf club during the swing by associating the position information on the virtual plane with a golf club model.

3. The simulation system according to claim 2,
    wherein the simulation apparatus further includes a filtering portion for filtering, using a low-pass filter, the position information on the virtual plane acquired by the position information acquiring portion; and
    wherein the simulation portion simulates the behavior of the golf club during the swing, based the filtered position information on the virtual plane.

4. The simulation system according to claim 3,
    wherein the low-pass filter has a cutoff frequency Z (Hz) that satisfies:

$$Z = k \cdot (1/X), k \geq 3$$

where,
    X: time (in seconds) it takes from the start of the down swing to the impact; and
    k: the filter factor (constant).

5. The simulation system according to claim 3, wherein the golf club model has a grip portion and a shaft portion of the golf club formed as elastic bodies.

6. The simulation system according to claim 1, wherein the at least three identification features are not aligned on the same line.

7. A simulation method for simulating a behavior of a golf club during a swing made by a golfer using the golf club, comprising the steps of:
    attaching at least three identification features to the golf club in such a manner of allowing the identification features to locate a closed virtual plane that follows a grip of the golf club during the swing;
    imaging, by at least two imaging devices, the identification features during the swing;
    acquiring, from position information on the at least three identification features thus imaged, position information on the closed virtual plane, defined by the at least three identification features, that follows the grip of the golf club, and simulating the behavior of the golf club during the swing based on position information on the virtual plane.

8. The swing simulation method according to claim 7, further comprising the step of filtering, using a low-pass filter, the position information on the virtual plane,
wherein the step of simulating the swing includes the use of the filtered position information on the virtual plane.

\* \* \* \* \*